United States Patent [19]

McIlwraith

[11] Patent Number: 5,020,866
[45] Date of Patent: Jun. 4, 1991

[54] ENCLOSURE FOR HOUSING ELECTRONIC COMPONENTS

[75] Inventor: George McIlwraith, Stone Mountain, Ga.

[73] Assignee: Gichner Systems Group, Inc., Dallastown, Pa.

[21] Appl. No.: 434,323

[22] Filed: Nov. 10, 1989

[51] Int. Cl.⁵ .............................................. A47B 88/00
[52] U.S. Cl. ................................... 312/265.4; 312/296
[58] Field of Search .......................... 312/265.1-265.4, 312/257.1, 296; 220/84

[56] References Cited

U.S. PATENT DOCUMENTS

| | | | |
|---|---|---|---|
| 846,452 | 3/1907 | Byrne | 220/84 |
| 2,167,525 | 7/1939 | Rosendale | 220/84 X |
| 3,026,367 | 3/1962 | Hartwell . | |
| 3,265,415 | 8/1966 | Durnbaugh et al. | 312/265.1 |
| 3,583,930 | 8/1971 | Ehrreich et al. . | |
| 3,736,035 | 5/1973 | Brown et al. . | |
| 3,812,316 | 5/1974 | Milburn . | |
| 3,890,022 | 6/1975 | Moon . | |
| 4,105,348 | 8/1978 | Anderson et al. . | |
| 4,281,883 | 8/1981 | Zacky . | |
| 4,468,067 | 8/1984 | Jenkins . | |
| 4,652,695 | 3/1987 | Busby . | |
| 4,659,869 | 4/1987 | Busby . | |
| 4,699,270 | 10/1987 | Bohm . | |
| 4,705,916 | 11/1987 | Wadhere et al. . | |
| 4,720,606 | 1/1988 | Senn . | |
| 4,768,845 | 9/1988 | Yeh . | |
| 4,782,637 | 11/1988 | Eriksson et al. . | |
| 4,864,076 | 9/1989 | Stickney . | |

Primary Examiner—Joseph Falk
Attorney, Agent, or Firm—Jones, Askew & Lunsford

[57] ABSTRACT

An improved device for providing EMI/RFI shielding for a joint is disclosed comprising a compressible, resilient sealing element and a conductive shielding element bonded to the sealing element and positioned such that the shielding element provides a direct electrical contact across the joint. The disclosed invention further provides a cabinet which effectively utilizes such a device. The disclosed invention also includes an improved cabinet construction which minimizes the paths by which moisture and debris may enter the cabinet interior, while providing a cabinet which is transportable without violating the integrity of the cabinet structure.

8 Claims, 4 Drawing Sheets

ENCLOSURE FOR HOUSING ELECTRONIC COMPONENTS

TECHNICAL FIELD

The present invention relates generally to cabinets, and more particularly to a cabinet for housing electronic components and the like which provides improved EMI/RFI shielding.

BACKGROUND OF THE INVENTION

In operation, computers, radios, transmitters and other electronic systems generate electrical signals in the form of radio frequency waves or electromagnetic radiation or both. If not properly shielded, these signals can interfere with the operation of unrelated equipment. Radio frequency interference ("RFI") is interference from sources of energy outside a system. Electromagnetic interference ("EMI") is interference, generally at radio frequencies, generated within the system. To prevent EMI/RFI interference, governmental regulations and industry standards require that the sources of radio frequency or electromagnetic radiation within a system be shielded.

At the same time, sensitive electronic components must also be protected from more tangible forms of disruption. Other sources of disruption to the operation of electronics systems are moisture and foreign particles, such as dust. The presence of either of these environmental hazards can corrode or otherwise debilitate electrical contacts.

One method of protecting such systems from EMI/RFI interferences and exposure to moisture and dust is to place the equipment in a shielded cabinet. To provide adequate protection, the cabinet is preferably designed to eliminate grooves, crevices, and other openings which allow passage of RF waves and which accumulate and channel moisture and debris into the interior of the cabinet. The top of a cabinet is a notorious site for the accumulation of moisture and debris which subsequently tend to find their way into the cabinet. Conventional cabinets generally utilize a top construction having a top panel secured between the frame members of the cabinet. This provides a uniform flat surface across the top of the cabinet. Unfortunately, this juncture between the top panel and the frame members also provides a channel that is difficult to seal and does not inherently inhibit the passage of RF waves, moisture or debris. An example of such a cabinet construction is found in U.S. Pat. No. 4,768,845.

There exists a further problem with respect to transporting these cabinets. Most cabinets are designed to remain in one location and are not designed with ease of transportation in mind. In order to transport a cabinet, it is often necessary to place straps or other securing devices around the cabinet structure. Other methods include inserting eyelets through the panels and frame members. The first technique has the disadvantage of placing stress on the cabinet which it may be ill-designed to resist. The second technique has the disadvantage of violating the integrity of the structure, thus providing openings which can permit EMI/RFI waves to pass and which can admit dust and moisture into the cabinet. Therefore, there exists a need for a cabinet which minimizes the passage of RF waves, moisture and debris, and which may be easily transported without stressing or violating the cabinet structure.

Another problem inherent in the design of cabinets concerns junctures or joints between components which form the cabinet. Such joints may be found between the cabinet frame and a door, or between the frame and panels connected to the frame. Solid metal cabinet components provide EMI/RFI shielding and protect against the intrusion of moisture and debris. However, each juncture between these components provides openings through which RF waves, moisture and debris may pass.

Several attempts have been made to provide a gasket for placement within these junctures to provide EMI/RFI shielding and to seal against the intrusion of moisture and debris. For example, U.S. Pat. No. 4,652,695 discloses a clip-on shielding strip designed to provide EMI/RFI shielding and which may be placed in the junctures between cabinet components. The device disclosed in the U.S. Pat. No. '695 utilizes a conductive mesh positioned around a resilient core. The core and mesh are secured to a metal clip with a clamping flange which clips to the mesh. The metal clip conductively contacts the cabinet frame and the conductive mesh conductively contacts to a side or door panel. This design has several disadvantages. The metal clip prevents this gasket from being fastened to curved surfaces and corners. Another disadvantage results from the juncture between the mesh and the clip, which juncture increases the resistance and thus adversely impacts the conductivity between the mesh and the metal clip. Additionally, this gasket provides a metal-to-metal interface which does not provide an effective seal against the passage of moisture and debris. Further, the metallic mesh is susceptible to a further reduction of conductivity by the accumulation of moisture and dirt on the mesh.

Another attempt to solve these problems is disclosed in U.S. Pat. No. 4,659,867. The U.S. Pat. No. '867 teaches a gasket having a conductive tubular element formed of an extruded, resilient elastomer conductively bonded to a U-shaped metal clip. This design attempts to provide EMI/RFI shielding and to seal against water and debris. However, since the same material is used for both the shielding and sealing functions, both are compromised. The elastomer does not provide as effective a barrier to moisture or debris as does a conventional rubber gasket and is more expensive. Furthermore, conductivity may be decreased by the accumulation of moisture and debris on the surface of the elastomer and by the resistant interface between the elastomer and metal clip. Additionally, the metal clip is not well suited for use on curved surfaces and corners.

Therefore, despite the various efforts found in the prior art, there remains a need for an improved gasket which can effectively shield against EMI/RFI and which can also provide an effective seal against moisture and debris.

SUMMARY OF THE INVENTION

The present invention overcomes the above-discussed disadvantages in the prior art by providing a device which provides improved EMI/RFI shielding, seals against the intrusion of moisture and debris, protects the shielding mechanism from degradation, and is conformable to curved surfaces and corners. The present invention also provides a cabinet which effectively utilizes such a device.

Additionally, the present invention further provides a cabinet which minimizes the paths by which moisture and debris may enter the cabinet interior and which may be more conveniently transported.

Generally described, in one aspect of the present invention, an improved gasket provides an EMI/RFI shield along a joint between a first surface and an abutting second surface. A compressible, resilient sealing member is mounted to the first surface and directly contacts the second surface to seal the joint against the passage of moisture and debris through the joint. A conductive shielding element is operatively associated with the sealing member and directly contacts the first and second surfaces for shielding against the passage of RF waves through the joint. Thus, the resilient sealing member provides protection against the passage of dirt, moisture, and debris, while the conductive shielding element protects the joint against the passage of EMI/RFI emissions.

Another aspect of the invention comprises a cabinet having a joint which is protected against debris, moisture, and RF waves. The cabinet includes a frame member and a panel abutting the frame member and defining a joint between the frame member and the panel. A compressible, resilient sealing member is mounted to the frame member and directly contacts the panel for sealing the joint against the passage of moisture and debris through the joint. A conductive shielding element operatively associated with the sealing member direct contacts the frame member and the panel to shield the joint against the passage of RF waves through the joint.

Still another aspect of the present invention relates to an RF cabinet which is easily transportable. The cabinet comprises a corner member having a plurality of brackets extending therefrom and positioned normal to one another. A plurality of frame members are slidably positioned over the brackets and abut the corner member, and a flange extends upwardly from the frame members. A top panel having a lip extending downwardly around its periphery is positioned exterior to the frame members and is further positioned to have its interior surface perpendicular to the flange. In the disclosed embodiment of the present invention, the cabinet further comprises a projection extending upwardly from the corner member into which eyelets may be threadably inserted without violating the integrity of the cabinet.

Thus, it is an object of the present invention to provide an improved EMI/RFI shielding device.

It is another object of the present invention to provide an EMI/RFI shielding device which seals against the intrusion of moisture and debris.

It is a further object of the present invention to provide an EMI/RFI shielding device which protects the shielding mechanism from degradation and exposure to moisture and debris.

Still another object of the present invention to provide an EMI/RFI shielding device that is suitable for use with curved surfaces and corners.

It is yet another object of the present invention to provide a cabinet which effectively utilizes an EMI/RFI shielding device.

It is a further object of the present invention to provide an improved cabinet construction.

It is another object of the present invention to provide a cabinet which minimizes the path by which moisture and debris may enter the cabinet interior.

Yet another object of the present invention is to provide a cabinet which is easily transported without violating the integrity of the structure.

Other objects, features, and advantages of the present invention will become apparent upon reading the following specification, when taken in conjunction with the drawings and the appended claims.

DETAILED DESCRIPTION OF THE DISCLOSED EMBODIMENT

Figure 1:
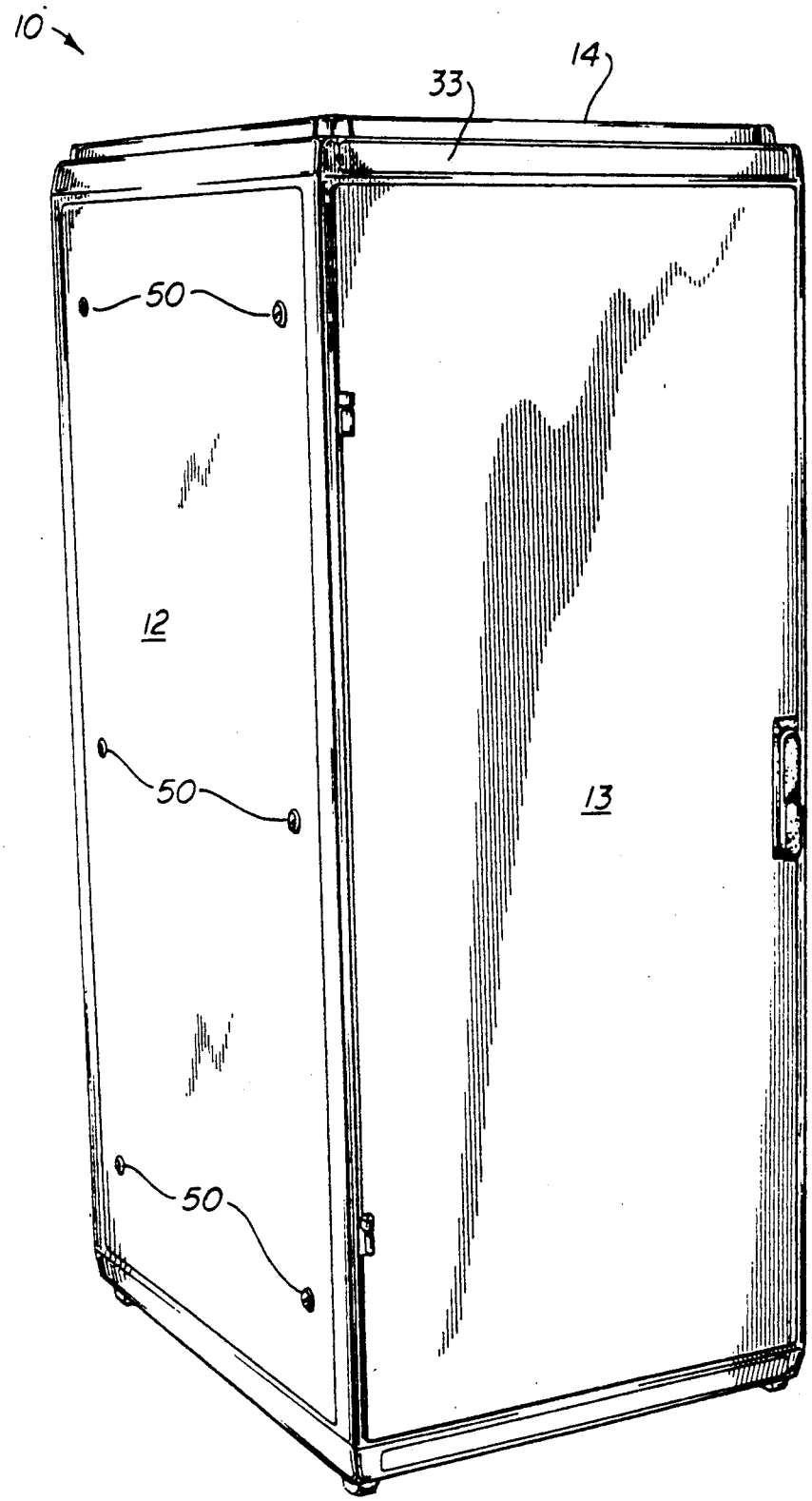
FIG. 1 is a perspective view of an EMI/RFI shielded cabinet.
Figure 2:
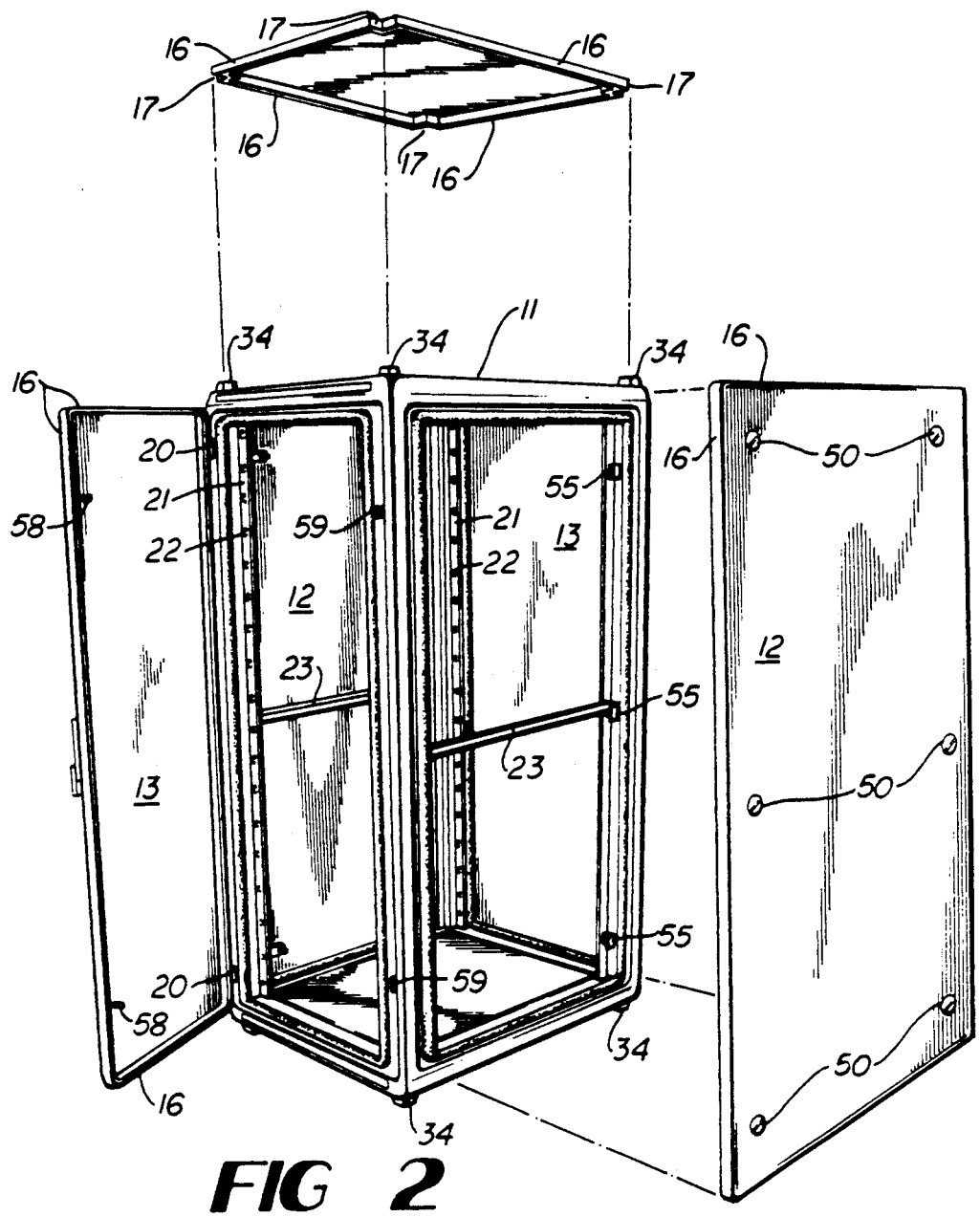
FIG. 2 is an exploded perspective view of the cabinet of FIG. 1, shown with the right panel and top exploded and the door open.

Referring now in more detail to the drawings, in which like numerals indicate like parts throughout the several views, FIGS. 1 and 2 show an EMI/RFI shielding cabinet 10 according to the present invention. The cabinet 10 has a frame 11, side panels 12, door panels 13, a top panel 14, and a bottom panel 15. Each of the panels 12-15 are rectangular in shape and have a lip 16 formed on their edges. The top panel 14 has a rectangular cutout 17 at each corner. The side panels 12 and top panel 14 are mounted to the frame 11 as will be described later. Doors 13 are mounted to the frame 11 with hinges 20. The bottom panel 15 is bolted directly to the frame 11. A joint is defined at the intersection of each of the panels 12-15 and the frame 11. Brackets 21, having holes 22, and supports 23 are mounted to the frame 11 and enable trays or drawers to be installed in the cabinet.

Figure 3:
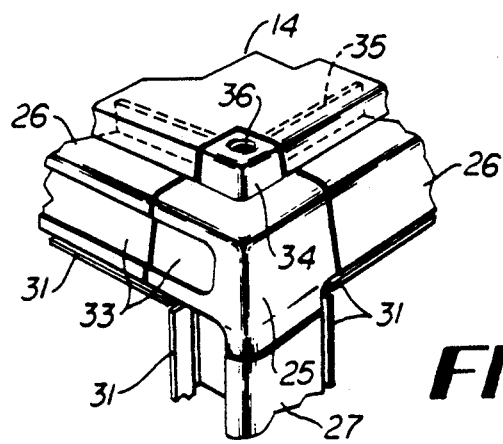
FIG. 3 is a perspective view of the corner construction of the cabinet of FIG. 1, showing the relationship between the corner and the top of the cabinet.
Figure 4:
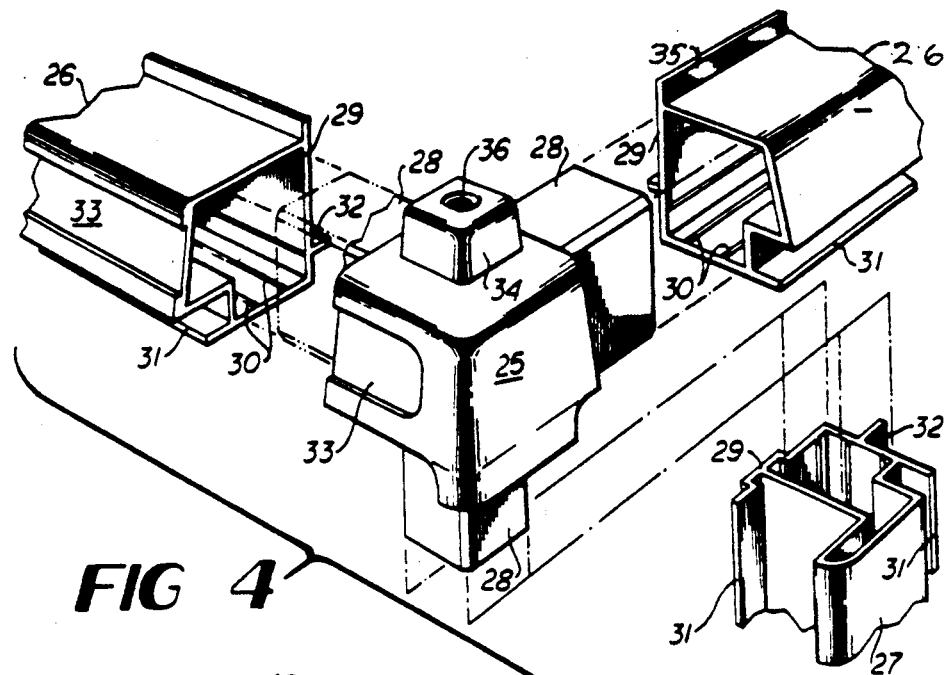
FIG. 4 is an exploded perspective view of the corner assembly of FIG. 3.
Figure 7:
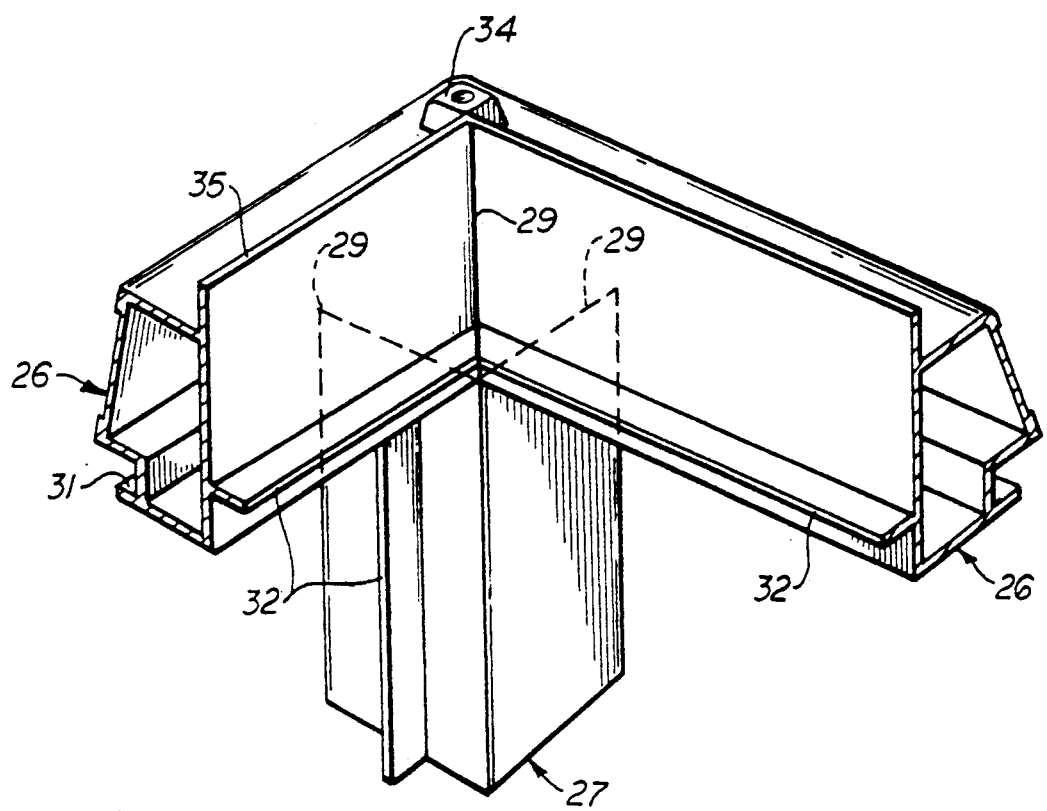
FIG. 7 is an interior perspective view of the corner construction of FIG. 3.

Referring now to FIGS. 3 and 4, the frame 11 of the cabinet 10 is constructed from a plurality of corner members 25, horizontal frame members 26 and vertical frame members 27. Extending from each corner member 25 are brackets 28. Each horizontal frame member 26 and vertical frame member 27 is slidably positioned over a bracket 28 and abuts the corner member 25. The horizontal frame members 26 and vertical frame members 27 may be welded or otherwise bonded to each other along their interior edges 29, as shown in FIG. 7, to inhibit the passage of RF waves, moisture and debris. A plurality of nipples 30 are defined on one or more interior surfaces of each of the horizontal frame members 26 and vertical frame members 27. The nipples 30 may be forcibly impressed into the brackets 28 to align the horizontal frame members 26 and the vertical frame member 27 with the corner member 25. Each horizontal frame member 26 and vertical frame member 27 also has a rim 31 defined thereon, onto which a gasket may be mounted. Ridges 32 are defined in each horizontal frame member 26 and vertical frame member 27 onto which supports 23 are mounted. A recess 33 is defined on the front surface of one side of the corner member 25 and one of the horizontal frame members 26 for placement of an emblem or sign.

With further reference to FIGS. 3 and 4, a projection 34 extends upwardly from the corner member 25. The top panel 14 is the same height as the projection 34 and is positioned flush with and abutting the projection 34 with the projection being received within a cutout 17 in the top panel 14. Extending upwardly from the inner edge of each horizontal frame members 26 is a flange 35. When the top is installed, each flange 35 is interior to and parallel to the lips 16 of the top panel 14. This lip and flange arrangement provides a barrier to the passage of RF waves, moisture and debris. As will be explained further, a gasket may be mounted on each flange 35 to provide enhanced EMI/RFI, moisture and debris protection.

As is further shown in FIG. 3, the upper end of each projection 34 has a threaded bore 36 formed therein. An eyelet, hook, or other device useful in transporting the cabinet may be threaded into the bore 36. Alternatively, wheels or casters may also be threaded into the bore of the bottom corner members to enable the cabinet 10 to be rolled from place to place.

Figure 5:
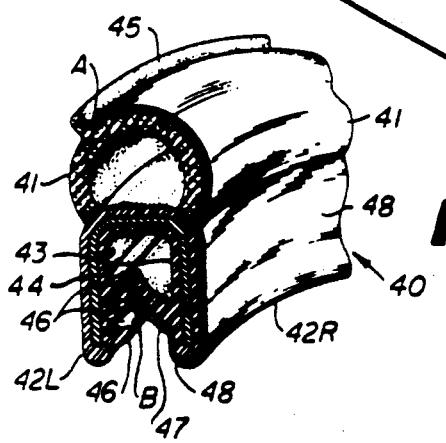
FIG. 5 is a perspective view of an EMI/RFI shielding gasket of the cabinet of FIG. 1.

FIG. 5 shows a gasket 40, having a tubular head 41. An interconnected pair of legs 42L and 42R having mutually facing surfaces 43 extend downwardly from the lower portion of the tubular head 41. A lug 44 is embedded within the legs 42L and 42R and maintains the legs in a mutually opposed relationship. The lug 44 is flexible, preferably being made from steel wire to allow the gasket 40 to conform to curved surfaces and corners. An ear 45 angles upwardly from the upper portion of the tubular head 41. On the mutually facing surfaces 43 of the legs 42L and 42R, a plurality of barbs 46 on the leg member 42L and a barb 47 on the leg member 42R angle upwardly and are spaced to frictionally engage a flange to allow secure positioning of the gasket 40 on a flange. The tubular head 41, legs 42L and 42R, ear 45, and barbs 46 and 47 are preferably made of rubber and coextruded with the lug 44. The gasket 40 of the disclosed embodiment is manufactured from a commerically available gasket produced by Emka, model no. 1011-05. However, the Emka model no. 1011-05 gasket is manufactured having two ears. To produce the gasket 40, one of the two ears is removed, and a conductive mesh 48, preferably a silver filled mesh, is laminated to the gasket 40 between points A and B, so that the mesh 48 covers the periphery of the gasket from the ear 45, across the tubular head 41, down the outer surface of leg 42R, and up an inner surface 43 to the tip of the barb 47.

Figure 6:
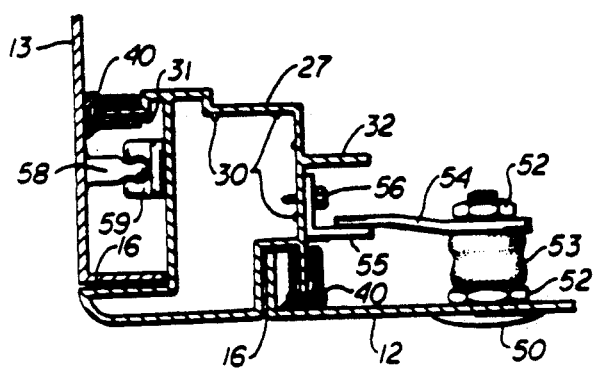
FIG. 6 is a cross sectional view taken along line 6—6 of FIG. 1, showing the EMI/RFI shielding gasket of FIG. 5 installed in the cabinet and depicting the relation between the gasket and a door and a side panel of the cabinet.

The cabinet 10 can be even more effectively protected from RF waves, moisture and debris by mounting the gasket 40 to flanges 35 or rims 31. As best shown in FIG. 6, the gasket 40 is mounted to a flange 35 or rim 31 by means of the legs 42L and 42R. The legs 42L and 42R are placed over the flange 35 or rim 31, and the barbs 46 and 47 frictionally engage the flange 35 or rim 31. The lug 44 may be compressed to increase the pressure exerted by legs 42L and 42R and barbs 46 and 47 on the flange 35 or rim 31.

As can be seen in FIGS. 5 and 6, the conductive mesh 48 extends up the inner surface of leg 42R and out to the tip of barb 47. Therefore, when the gasket 40 is mounted on a flange 35 or rim 31, the mesh 48 at point B on the gasket is in direct contact with the flange or rim. Also, when the door panels 13 are closed and the side panels 12 are mounted, the interior surfaces of the panels are in direct contact with the conductive mesh 48 across the upper edge of the tubular head. This provides a barrier to the passage of RF waves. At the same time, the ear 45 is also in direct contact with the interior surfaces of the panels 12-15. Moisture and debris are restrained from passing through each joint by the tubular head 41 and ear 45. Furthermore, the ear 45 protects the conductive mesh 48 from exposure to moisture and debris, thus protecting the electrical connection between the doors or side panels and the frame members.

Referring further to FIG. 6, each side panel 12 has a hole defined therein through which a bolt 50 is inserted. To install the bolt 50, nut 52 is threadably received on the bolt, followed by a bushing 53, a latch arm 54 and another nut 52. A mounting plate 55 is mounted to each vertical frame member 27 by a screw 56. To mount each side panel 12, each bolt 50 is rotated to position the latch arm 54 against the mounting plate 55. A slot or other configuration may be provided on each bolt 50 to facilitate rotation. Mounted on each door panel 13 is a peg 58. Peg 58 is positioned to engage a catch 59 mounted to the vertical frame member 27. The catch 59 and peg 58 operate to maintain the door 13 in contact with the gasket 40.

As can be seen, the top panel 14 of cabinet 10 has lips 16 depending downwardly from its periphery and mounted exterior to the flange on each of the horizontal frame members 26. The cooperative relation between the upwardly projecting flange and the downwardly depending lip provides a barrier to the passage of RF waves, moisture and debris through the joint which exists between the top panel and the horizontal frame members.

Another feature of the cabinet 10 is the provision of projections 34, having bores 36 therein, extending from the top and bottom of the cabinet frame 11, without penetrating into the cabinet interior. This is advantageous, as eyelets or casters can be threaded into the bores, and the cabinet is able to be lifted or rolled with the weight being transmitted directly to the frame rather than through one of the panels 12-15. This feature also allows eyelets or casters to be installed without violating the integrity of the cabinet. The construction of the cabinet 10, utilizing panels 12-15, corner members 25, horizontal frame members 26, and vertical frame members 27 also allows all welds to be placed on the interior of the cabinet, thus eliminating polishing or grinding of the welds. Furthermore, the nipples 30 allow relaxed tolerances in the manufacture of the horizontal frame members 26 and the vertical frame members 27, as the nipples may be forcibly embedded into the brackets 28 to align the frame members 26 and 27 with the corner member 25.

The gasket 40 offers improved EMI/RFI shielding by providing a continuous conductive mesh which directly contacts two abutting surfaces, such as the flange 35 and an interior surface of side panel 12. This is advantageous, in that the number of resistant interfaces between the flange 35 and the side panel 12 is minimized. The tubular head 41 and the ear 45 on the gasket 40 prevent moisture and debris from passing through each of the joints. Not only do the tubular head and ear prevent RF waves, moisture and debris from passing through the joint, but also, since moisture can oxidize the surface of the mesh, and the accumulation of debris can increase the resistance between the mesh and the surface it contacts, the integrity of the mesh's conductivity is preserved.

Another feature of the present invention pertains to the conductive mesh 48 extending around the base of the leg 42R, between the inner surface 43 of the leg 42R and the corresponding flange 35 or rim 31, and to the tip of the barb 47. The advantage of this feature is twofold. First, by directly contacting the mesh 48 against the corresponding flange 35 or rim 31 and the side panel 12 or door panel 13, a better shielding interface is obtained. Secondly, the barb 47 exerts a clamping force to impress the mesh against the flange or rim.

Since ventilation is often required for the operation of electrical equipment, a fan and filter may be installed on the gasket without greatly diminishing the effectiveness of the cabinet and gaskets. Such vents utilize a filter to reduce the passage of moisture and debris into the cabinet, and the conventional grid construction effectively discourages the passage of RF waves.

As will be apparent to one skilled in the art, any of the panels 12-15 may alternatively be mounted with fasteners, hinges, bolts, or other fastening devices, without detracting from the spirit of this invention. Also, while the foregoing embodiment is disclosed with respect to a cabinet having two door panels 13 and two side panels 12, it will be appreciated that the same principles of construction may be applied to a cabinet having a greater or lesser number of doors 13 in place of some or all of the side panels 12.

Other objects, features, and advantages of the present invention will become apparent upon reading the following detailed description of the preferred embodiment of the invention when taken in conjunction with the drawings and the appended claims.

What is claimed is:

1. A cabinet comprising:
   a corner member having a plurality of brackets extending therefrom and positioned normal to one another.
   a plurality of frame members corresponding to said plurality of brackets, one of said frame members being slidably positioned over each of said brackets and abutting said corner member;
   a flange extending upwardly from each of said plurality of frame members; and
   a top panel having a downwardly extending lip formed around its periphery, said top panel being positioned atop said plurality of frame members such that said lip on said top panel is disposed exteriorly of said flange on said plurality of frame members such that said flange extends upwardly toward said top panel at a point inside outer periphery.

2. The cabinet of claim 1, wherein said frame members are bonded to one another.

3. The cabinet of claim 1, further comprising a gasket attached to said flange on each of said plurality of frame members, a portion of said gasket extending between said top panel and said flange to effect a seal between said top panel and said flange.

4. The cabinet of claim 1, wherein said top panel further comprises lateral edges, and wherein said corner member further comprise a projection extending upwardly therefrom and having a lateral surface abutting said lateral edges of said top panel.

5. The cabinet of claim 4, wherein said projection has a height substantially corresponding to the height of said top panel.

6. The cabinet of claim 1, wherein said top panel further comprises rectangular cutouts defined in each corner of said top panel, and wherein said corner member further comprises a projection extending upwardly therefrom and projecting through said cutouts in said top panel.

7. The cabinet of claim 3, wherein said gasket comprises:
   a sealing device including a compressible, resilient elongate head and a pair of legs extending downwardly from said elongate head, said flange being positioned between said legs; and
   a conductive material disposed between said legs in contact with said flange and extending upwardly along the outer surface of one of said legs and a portion of said elongate head, such that said conductive material and said compressible resilient head may directly contact said panel for substantially shielding said joint against the passage of RF waves, moisture and debris through said joint.

8. The cabinet of claim 6, wherein said rectangular cutouts define lateral edges and said projection defines a lateral surface positioned to abut said lateral edges.

* * * * *